United States Patent
Yamaguchi

(10) Patent No.: US 7,223,634 B2
(45) Date of Patent: May 29, 2007

(54) SEMICONDUCTOR DEVICE, METHOD FOR MANUFACTURING THE SAME, CIRCUIT BOARD, AND ELECTRONIC APPARATUS

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/898,174

(22) Filed: Jul. 26, 2004

(65) Prior Publication Data

US 2005/0048698 A1    Mar. 3, 2005

(30) Foreign Application Priority Data

Jul. 31, 2003    (JP) .............................. 2003-283666

(51) Int. Cl.
*H01L 21/00* (2006.01)

(52) U.S. Cl. ............................... 438/108; 257/E21.503

(58) Field of Classification Search ........ 438/106–110, 438/612–617, 618, 620, 622, 112–114; 257/778, 257/E21.503, E21.511

See application file for complete search history.

(56) References Cited

U.S. PATENT DOCUMENTS

| | | | |
|---|---|---|---|
| 6,322,903 B1 | 11/2001 | Siniaguine et al. | |
| 6,472,758 B1 * | 10/2002 | Glenn et al. .................. | 257/777 |
| 6,608,371 B2 | 8/2003 | Kurashima et al. | |
| 6,787,866 B2 * | 9/2004 | Fujii et al. .................... | 257/415 |
| 6,800,930 B2 * | 10/2004 | Jackson et al. .............. | 257/700 |
| 6,873,054 B2 * | 3/2005 | Miyazawa et al. ........... | 257/774 |
| 6,903,442 B2 * | 6/2005 | Wood et al. .................. | 257/621 |
| 6,919,725 B2 * | 7/2005 | Bertness et al. .............. | 324/433 |
| 6,953,748 B2 * | 10/2005 | Yamaguchi .................. | 438/667 |
| 2002/0159242 A1 * | 10/2002 | Nakatani et al. ............. | 361/760 |
| 2003/0100143 A1 * | 5/2003 | Mulligan et al. ............ | 438/113 |
| 2003/0124762 A1 * | 7/2003 | Hashimoto ................... | 438/67 |
| 2004/0192033 A1 * | 9/2004 | Hara ........................... | 438/667 |
| 2004/0251554 A1 * | 12/2004 | Masuda ....................... | 257/773 |
| 2005/0046002 A1 * | 3/2005 | Lee et al. .................... | 257/678 |

FOREIGN PATENT DOCUMENTS

| | | |
|---|---|---|
| JP | 2000-150726 | 5/2000 |
| JP | A-2002-50738 | 2/2002 |
| JP | A-2003-501805 | 1/2003 |
| JP | 2003-110084 | 4/2003 |
| JP | 2003-142647 | 5/2003 |
| JP | A-2003-282819 | 10/2003 |
| JP | 2004-158537 | 6/2004 |
| JP | 2004-273525 | 9/2004 |
| WO | WO 00/74136 A1 | 12/2000 |

* cited by examiner

*Primary Examiner*—Brook Kebede
(74) *Attorney, Agent, or Firm*—Oliff & Berridge, PLC

(57) ABSTRACT

Exemplary embodiments of the present invention include a semiconductor device, a method for manufacturing the same, a circuit board and an electronic apparatus with increased productivity and reliability. An exemplary method for manufacturing a semiconductor device of the present invention includes forming a conductive part in a concave part on a first surface of a semiconductor substrate, the first surface having a plurality of chip mounting areas. Stacking at least one semiconductor chip in each of the chip mounting areas, providing a sealing member on the first surface of the semiconductor substrate and making part of a second surface of the semiconductor substrate thin so as to make the conductive part penetrate from the first surface to the second surface.

16 Claims, 9 Drawing Sheets

SEMICONDUCTOR DEVICE, METHOD FOR MANUFACTURING THE SAME, CIRCUIT BOARD, AND ELECTRONIC APPARATUS

BACKGROUND OF THE INVENTION

1. Field of Invention

The present invention relates to a semiconductor device, a method for manufacturing the same, a circuit board and an electronic apparatus.

2. Description of Related Art

Some related art semiconductor devices employ three dimensional packaging technology. One way to reduce the total thickness of such devices is thinly grinding each semiconductor substrate. The related art includes a plurality of semiconductor chips are stacked to form a semiconductor device. This, however, requires handling by the unit of the semiconductor chips throughout a manufacturing process and fails to provide high productivity. Alternatively, a plurality of semiconductor wafers can be stacked and then separated into pieces. This also involves problems of not only reducing yield, but also making it difficult to handle the semiconductor wafers whose thickness has been reduced. The related art also includes a device disclosed in Japanese Unexamined Patent Publication No. 2002-50738.

SUMMARY OF THE INVENTION

An exemplary embodiment of the invention includes a semiconductor device, a method for manufacturing the same, a circuit board and an electronic apparatus with increased productivity and reliability.

An exemplary method for manufacturing a semiconductor device of the present invention includes: (a) forming a conductive part in a concave part on a first surface of a substrate, the first surface having a plurality of chip mounting areas; (b) stacking a semiconductor chip in the chip mounting areas; (c) providing a sealing member on the first surface of the substrate; and (d) making part of a second surface of the substrate thin so as to make the conductive part penetrate from the first surface to the second surface. In the present invention, the substrate is reinforced by the sealing member. Therefore, it is possible to make the substrate thin in a stable manner enhances and/or improves reliability. Since the substrate has the plurality of chip mounting areas, it is possible to collectively manufacture semiconductor devices having a multiple stack structure, and thereby enhances and/or improves productivity.

After steps (a) through (d), the method for manufacturing a semiconductor device may also include the step of cutting a portion between the chip mounting areas to make a plurality of pieces.

In the exemplary method for manufacturing a semiconductor device, the sealing member may be cut with a first cutter and the substrate may be cut with a second cutter. This makes it possible to cut plural objects in an enhanced or the best way for each of the objects. This also makes it possible to avoid cutting defects even if some chips of the sealing member cling to the first cutter, by using not the first cutter but the second cutter for cutting the substrate.

In the exemplary method for manufacturing a semiconductor device, step (a) may include the steps of forming the concave part on the substrate, forming an insulating layer inside the concave part, and forming the conductive part in the concave part with the insulating layer therebetween.

In the exemplary method for manufacturing a semiconductor device, step (b) may include the step of mounting at least one chip in each of the chip mounting areas.

In the exemplary method for manufacturing a semiconductor device, step (b) may include the step of stacking a dummy chip in any of the chip mounting areas. This makes it possible to even out the sealing member and to reduce or prevent the sealing member from leaning to one side, and also from including air bubbles. This enhances and/or improves reliability in the sealing step.

In the exemplary method for manufacturing a semiconductor device, step (b) may include the step of mounting at least one chip in each of the chip mounting areas, the chip being either the semiconductor chip or the dummy chip.

In the exemplary method for manufacturing a semiconductor device, the semiconductor chip may include a penetrating electrode penetrating to the both sides. Also, step (b) may include the step of electrically coupling the semiconductor chip to the conductive part on the substrate with the penetrating electrode therebetween. Electrical conductivity on the both sides is thus provided by the penetrating electrode, which is particularly effective in providing a multiple stack structure.

In the exemplary method for manufacturing a semiconductor device, step (b) may include the step of electrically coupling the semiconductor chip to the conductive part on the substrate with a wire therebetween.

In the exemplary method for manufacturing a semiconductor device, step (c) may include the steps of forming a mask having an opening on the first surface side of the substrate and filling the opening with a material of the sealing member.

In the exemplary method for manufacturing a semiconductor device, step (c) may be performed in a chamber of which pressure is reduced from atmospheric pressure. This reduces or prevents air bubbles from remaining in the sealing member.

After step (d), the exemplary method for manufacturing a semiconductor device may also include the step of forming a wiring layer including a plurality of land parts electrically coupled to the conductive part. While the substrate is made thin, it is possible to provide the wiring layer in a stable manner since the semiconductor chip and the sealing member are provided on the first surface to reinforce the substrate.

The exemplary method for manufacturing a semiconductor device may also include forming a resin layer on the second surface side of the substrate. Also, the land parts may be formed on the resin layer. In this way, the stress imposed on the land parts is effectively released by the resin layer.

The exemplary method for manufacturing a semiconductor device may also include providing an external terminal on the land parts.

In the exemplary method for manufacturing a semiconductor device, the substrate may be a semiconductor substrate. This makes it possible to reduce a signal delay and provide high-speed signal processing.

In the exemplary method for manufacturing a semiconductor device, a plurality of integrated circuits may be provided on the semiconductor substrate, placed in each of the chip mounting areas, and electrically coupled to the conductive part.

In the exemplary method for manufacturing a semiconductor device, the substrate may be an interposer.

A semiconductor device of the present invention includes a substrate which includes a plurality of chip mounting areas on a first surface and a penetrating electrode penetrating from the first surface to a second surface. The semiconductor device also includes a semiconductor chip stacked in each of the chip mounting areas of the substrate, and a sealing member provided on the first surface of the substrate.

In the semiconductor device, the substrate may be a semiconductor substrate.

In the semiconductor device, a plurality of integrated circuits may be provided on the semiconductor substrate, placed in each of the chip mounting areas, and electrically coupled to the penetrating electrode.

In the semiconductor device, a portion between the chip mounting areas may be cut.

A circuit board of the present invention includes the above-mentioned semiconductor device that is mounted.

An electronic apparatus of the present invention includes the above-mentioned semiconductor device.

DETAILED DESCRIPTION OF PREFERRED EMBODIMENTS

Figure 1A:
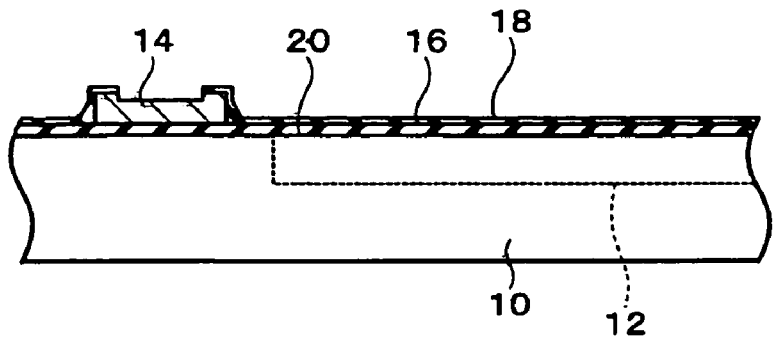
FIGS. 1A through D are schematics that show a method for manufacturing a semiconductor device according to the first exemplary embodiment of the present invention.

Exemplary embodiments of the present invention are described below with reference to the accompanying drawings.

FIGS. 1A through 8 illustrate a semiconductor device and a method for manufacturing the semiconductor device according to a first exemplary embodiment of the present invention. First, a substrate (semiconductor substrate 10) is prepared. The present embodiment uses the semiconductor substrate (a silicon substrate, for example) 10 as this substrate. The semiconductor substrate 10 may be a semiconductor wafer. In the present exemplary embodiment, an integrated circuit (IC) 12 is provided in the plural number to the semiconductor substrate 10 as shown in FIG. 3A. An electrode (a pad, for example) 14 that is electrically coupled to the IC 12 may be also provided on the semiconductor substrate 10. Multiple electrodes 14 may be provided to each IC 12. The multiple electrodes 14 may be aligned along edges of the IC 12, for example, along two opposing sides or four sides of the rectangular area of the IC 12. Typically, the electrode 14 is made of metal such as aluminum and copper.

On the semiconductor substrate 10, passivation films 16 and 18 are provided, each film made up of one layer or more. The passivation films 16 and 18 are made of $SiO_2$, SiN, or polyimide resin, for example. In the example shown in FIG. 1A, the electrode 14 and a wiring (not shown) coupling the IC 12 and the electrode 14 are provided on the passivation film 16. The passivation film 18 is provided, leaving out at least part of the surface of the electrode 14. Alternatively, the passivation film 18 may be formed to cover the surface of the electrode 14 and then partly etched to expose part of the electrode 14. Here, etching may be either dry etching or wet etching. While etching the passivation film 18, the surface of the electrode 14 may be also etched.

Figure 1B:
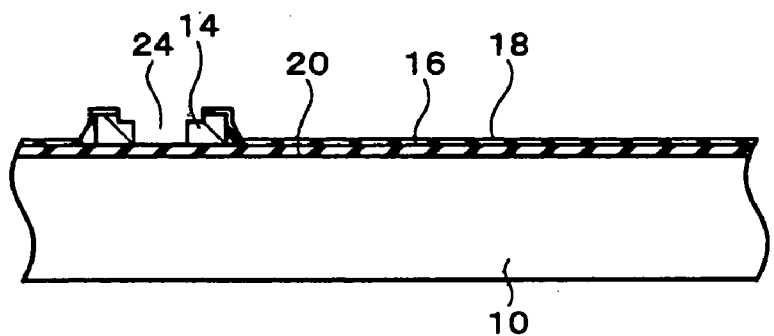
Figure 1C:
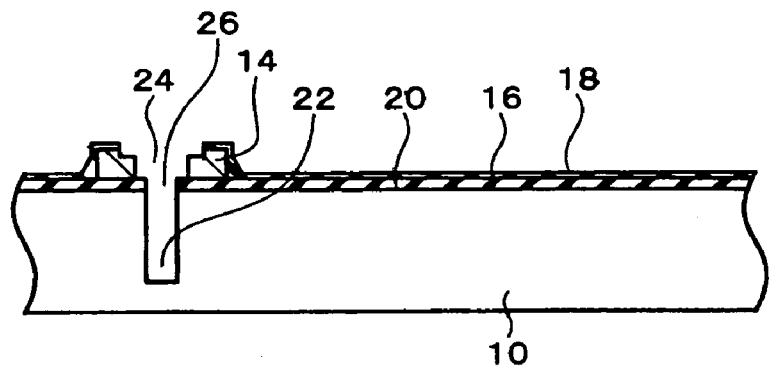

In the present exemplary embodiment, a concave part 22 is formed on a first surface 20 of the semiconductor substrate 10 as shown in FIG. 1C. The first surface 20 is on the side where the electrode 14 (the IC 12) is provided. The concave part 22 is provided, leaving out elements and wirings of the IC 12. As shown in FIG. 1B, a through-hole 24 may be formed on the electrode 14. Forming the through-hole 24 may be achieved by etching (dry etching or wet etching). This etching may be performed after forming a resist (not shown) that is patterned by lithography. If the passivation film 16 is provided under the electrode 14, a through-hole 26 is provided to the passivation film 16, too, as shown in FIG. 1C. If an etchant used for the electrode 14 does not work on the passivation film 16, another etchant may be used to form the through-hole 26. In this case, another resist (not shown) patterned by lithography may be formed.

As shown in FIG. 1C, the concave part 22 is formed in the semiconductor substrate 10 in a way that it communicates with the through-hole 24 (and the through-hole 26). It can be also said that both the through-hole 24 (and the through-hole 26) and the concave part 22 form a concave part. Forming the through-hole 22 may be also achieved by etching (dry etching or wet etching). This etching may be performed after forming a resist (not shown) that is patterned by lithography. Alternatively, the concave part 22 may be formed with a laser (e.g. $CO_2$ laser, YAG laser). Such a laser may be also used for forming the through-holes 24 and 26. Moreover, the concave part 22 and the through-holes 24 and 26 are sequentially formed using a single type of etchant or laser. For another example, the concave part 22 may be formed by sandblasting.

Figure 1D:
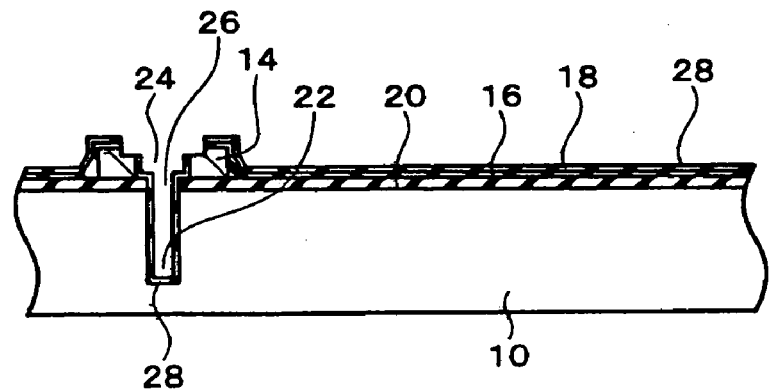

As shown in FIG. 1D, an insulating layer 28 may be provided inside the concave part 22. The insulating layer 28 may be an oxide film or a nitride film. For example, if the semiconductor substrate 10 is made of silicon, the insulating layer 28 may be a film of $SiO_2$ or SiN. The insulating layer 28 is formed on the bottom of the concave part 22. Also, the insulating layer 28 is formed on the inner wall of the concave part 22. It should be noted that the insulating layer 28 does not fill the concave part 22. In other words, the insulating layer 28 forms a concave part. The insulating layer 28 may be formed on the inner wall of the through-hole 26 in the passivation film 16. Also, the insulating layer 28 may be formed on the passivation film 18.

The insulating layer 28 may be formed on the inner wall of the through-hole 24 in the electrode 14. The insulating layer 28 is provided, leaving out part of the electrode 14 (its upper surface, for example). Alternatively, the insulating layer 28 may be formed to cover the surface of the electrode 14 and then partly etched (dry etching or wet etching) to expose part of the electrode 14. This etching may be performed after forming a resist (not shown) that is patterned by lithography.

Figure 2A:
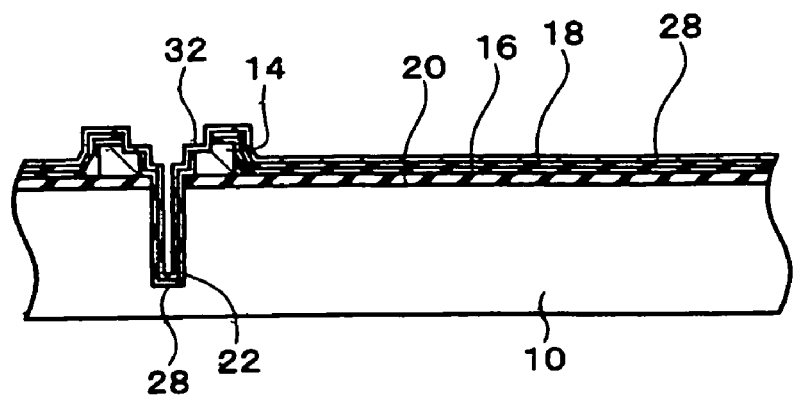
FIGS. 2A through D are schematics that show the method for manufacturing a semiconductor device according to the first exemplary embodiment of the present invention.
Figure 2B:
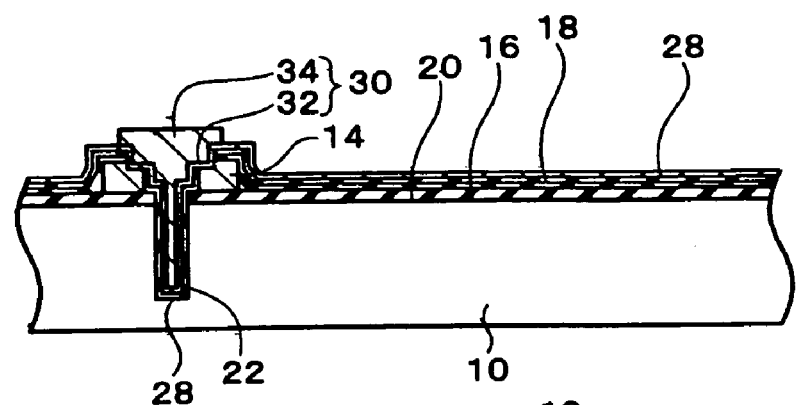

Subsequently, a conductive part 30 is provided to the concave part 22 (or inside of the insulating layer 28, for example) as shown in FIG. 2B. The conductive part 30 may be made of copper or tungsten. As shown in FIG. 2A, an external layer 32 of the conductive part 30 may be formed first and then a central part 34 may be formed. The central part 34 may be made either of copper, tungsten, or doped polysilicon (low-temperature polysilicon, for example). The external layer 32 may at least include a barrier layer. This barrier layer prevents the central part 34 or a material of a seed layer that will be described below from diffusing into the semiconductor substrate 10 (made of silicon, for example). The barrier layer may be made of a different material (e.g. TiW, TiN) from that of the central part 34. If the central part 34 is formed by electrolytic plating, the external layer 32 may include a seed layer. The seed layer is formed after forming a barrier layer. The seed layer is made of the same material (copper, for example) as that of the central part 34. Here, the conductive part 30 (or at least the central part 34) may be formed by electroless plating or ink jetting.

Figure 2C:
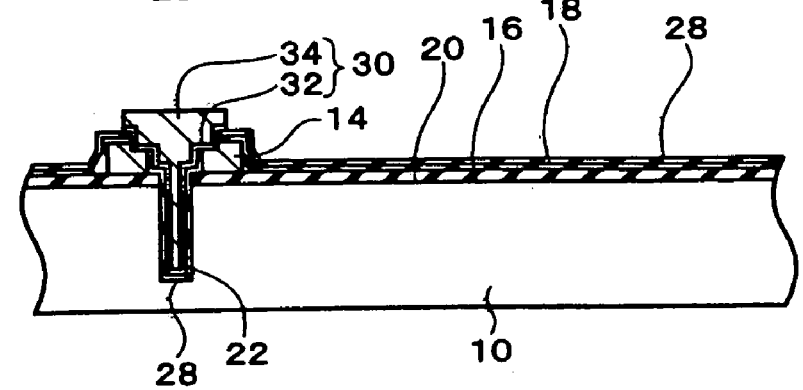

If the external layer 32 is also formed on the passivation film 18 as shown in FIG. 2B, part of the external layer 32 that covers the passivation film 18 (and the insulating layer 28) is etched as shown in FIG. 2C. Then, the central part 34 is provided after completing the external layer 32, both making up the conductive part 30. Part of the conductive part 30 is inside the concave part 22 in the semiconductor substrate 10. Since the insulating layer 28 stands between the inner wall of the concave part 22 and the conductive part 30, an electrical connection between the two is not available. The conductive part 30 is electrically coupled to the electrode 14 (the IC 12). For example, part of the electrode 14 not covered by the insulating layer 28 may have contact with the conductive part 30. Also, part of the insulating layer 30 may be placed on the passivation film 18. The conductive part 30 may be limited in the area of the electrode 14. The conductive part 30 may also project at least above the concave part 22. For example, the conductive part 30 may project farther than the passivation film 18 (and the insulating layer 28).

As an exemplary modification, the central part 34 may be formed with the external layer 32 remaining on the passivation film 18. In this exemplary embodiment, a layer communicating with the central part 34 that has been developed on the passivation film 18 needs to be etched.

Figure 2D:
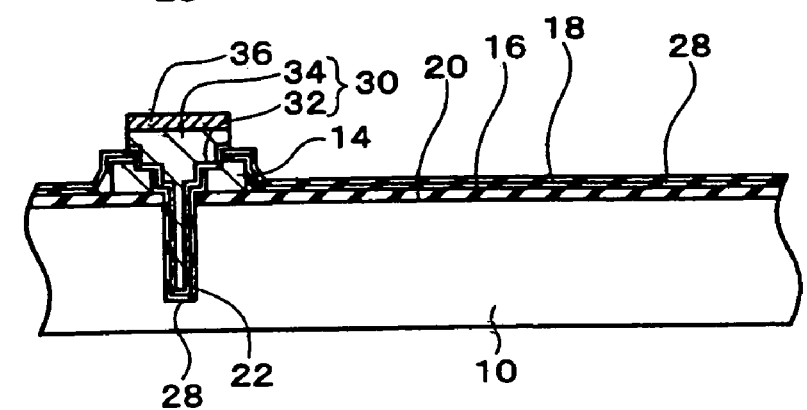

As shown in FIG. 2D, a brazing material 36 may be provided on the conductive part 30. More specifically, the brazing material 36 is provided on a tip of the conductive part 30 projecting from the first surface 20. The brazing material 36 is made of solder, for example, either soft solder or hard solder. The brazing material 36 may be also formed while covering the area other than the conductive part 30 with a resist.

Figure 3A:
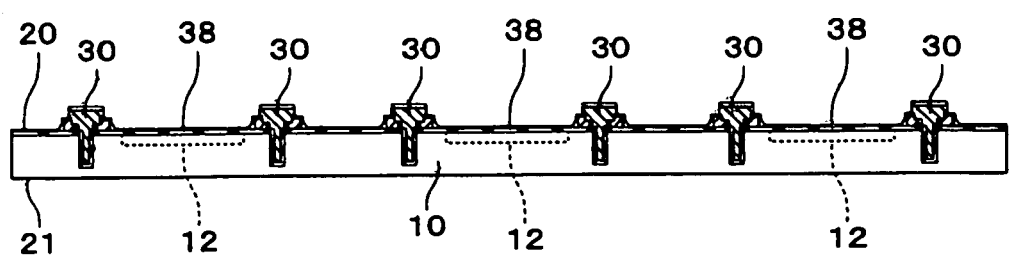
FIGS. 3A and B show a semiconductor device and the method for manufacturing the same according to the first exemplary embodiment of the present invention.

As shown in FIG. 3A, multiple chip mounting areas 38 are provided on the first surface 20 of the semiconductor substrate 10. Each of the chip mounting areas 38 are allocated to each associated area. The chip mounting area 38 may be provided in a plurality of lines and rows. Each chip mounting area 38 may be positioned associated with each IC 12 (or each of the electrode 14 provided in the plural number). In other words, each IC 12 is formed in the associated chip mounting area 38. At this stage, the conductive part 30 does not reach a second surface 21 (a surface that is opposite to the first surface 20). Accordingly, the tip of the conductive part 30 on the second surface 21 side remains inside the semiconductor substrate 10.

Figure 3B:
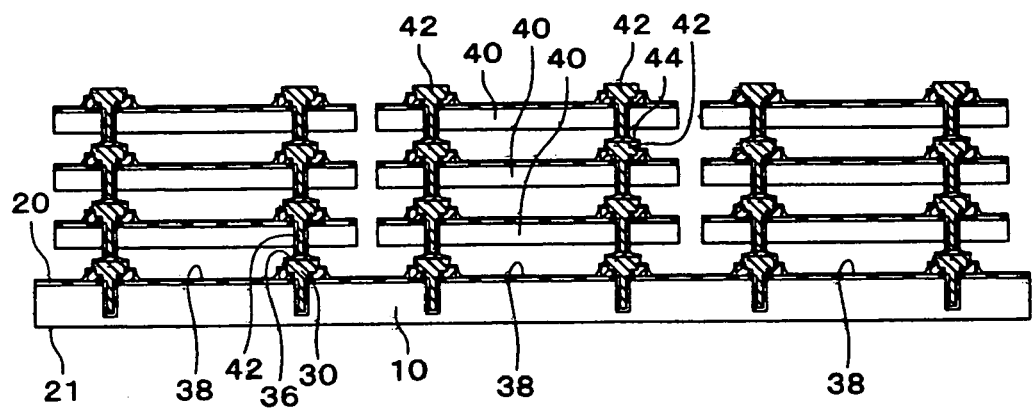

As shown in FIG. 3B, at least one semiconductor chip 40 is stacked in each chip mounting area 38. One semiconductor chip 40 may be stacked in a single layer or in multiple tiers (three in FIG. 3B) in each chip mounting area 38. Provided in the semiconductor chip 40 is an IC (not shown). In the present exemplary embodiment, the semiconductor chip 40 includes a penetrating electrode 42 that penetrates to both sides of the semiconductor chip 40. The semiconductor chip 40 may be electrically coupled to the conductive part 30 of the semiconductor substrate 10 through the penetrating electrode 42. The brazing material 36 may be used here to establish an electrical connection between the penetrating electrode 42 and the conductive part 30. When the semiconductor chip 40 is stacked in multiple tiers, the brazing material 44 may provide an electrical connection between an upper penetrating electrode 42 and a lower penetrating electrode 42. Electrical conductivity on the both sides is provided by the penetrating electrode 42, which is particularly effective in providing a multiple stack structure.

If the chip mounting area 38 of the semiconductor substrate 10 has any defects (for example, a defect in the IC 12 or the conductive part 30), it is possible not to mount a semiconductor chip 40 in this chip mounting area 38 and leave the area as an empty space. The semiconductor chip 40 that is nondefective will not be wasted in this way. Instead of making an empty space, a dummy chip may be stacked in the chip mounting area 38 having a defect. This dummy chip is preferably made of a material (e.g. a semiconductor chip, a resin chip) whose outer shape is the same as or similar to that of the semiconductor chip 40 that is nondefective. Also, the dummy chip is preferably stacked to nearly the same height as the semiconductor chip 40 that is nondefective. By using this dummy chip, it is possible to improve reliability in the following sealing step.

Figure 4A:
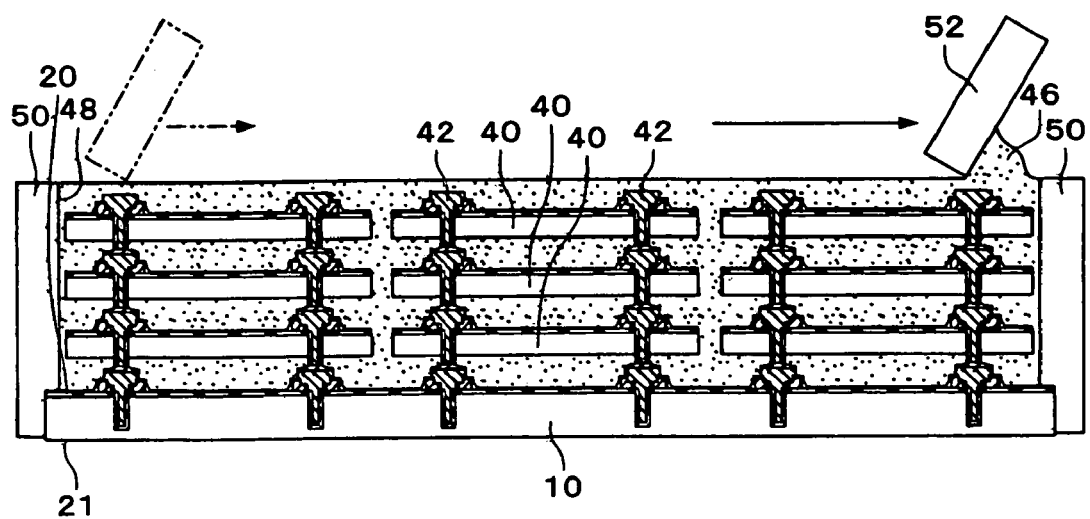
FIGS. 4A and B show the semiconductor device and the method for manufacturing the same according to the first exemplary embodiment of the present invention.

As shown in FIG. 4A, a sealing member 46 is provided on the first surface 20 of the semiconductor substrate 10. The sealing member 46 may be made of a resin material (epoxy resin, for example). The sealing member 46 seals at least an electrical connection, for example, a connection between one penetrating electrode 42 and another penetrating electrode 42, and a connection between the conductive part 30 and the penetrating electrode 42. The sealing member 46 may seal at least one semiconductor chip 40. As shown in FIG. 4A, it may seal all the semiconductor chip 40 provided on the first surface 20. This sealing step is performed by pouring a liquid material of the sealing member 46 onto the first surface 20. When the semiconductor chip 40 (and the dummy chip) is provided in the plural number on the semiconductor substrate 10 in an orderly manner, that is, no empty space is provided in the chip mounting area 38, the sealing member 46 can be poured evenly. This reduces or prevents the sealing member 46 from leaning to one side, and also from including air bubbles. This eventually improves reliability in the sealing step.

The sealing member 46 may be provided using a printing method (screen printing, for example). As shown in FIG. 4A, a material of the sealing member 46 may be filled in an opening 48 of a mask 50 (for example, a metal mask) that is provided on the first surface 20 side. In this case, the upper surface of the sealing member 46 may be planarized to the same height as the mask 50 using a squeegee 52. Alternatively, a material of the sealing member 46 may be applied using a dispenser (potting), and be molded using a die (molding). Also, a material of the sealing member 46 may be discharged using ink jetting, which is a method applied to inkjet printers.

The sealing step may be performed in a chamber with reduced pressure. The chamber is preferably depressurized to vacuum with a required degree of tolerance. This reduces or prevents air bubbles from remaining in the sealing member 46, and thereby improving or enhancing reliability of the semiconductor device.

Figure 4B:
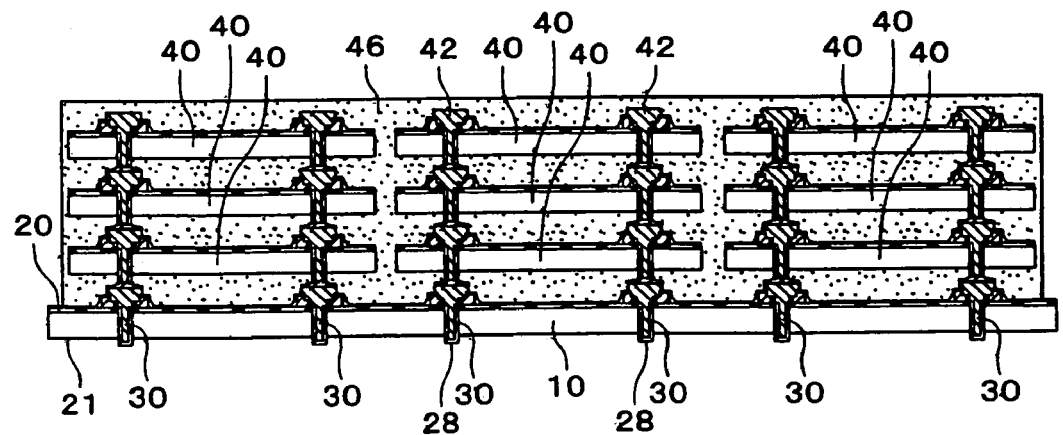

Subsequently, the mask 50 is removed, and a sealing with the sealing member 46 is completed on the semiconductor substrate 10. As shown in FIG. 4B, the thickness of the semiconductor substrate 10 is partly reduced from the second surface 21 side. This may be preformed by at least one mechanical or chemical grinding method. The surface of the semiconductor substrate 10 may be ground and polished with a grinding stone, or may be etched. Since the semiconductor substrate 10 is reinforced by the sealing member 46 in the present embodiment, it is possible to steadily perform grinding and polishing or etching of the semiconductor substrate 10. So there is no need for providing the semiconductor substrate 10 with a reinforcing member, and thereby simplifying the manufacturing process and equipment required. Making the semiconductor substrate 10 thin may be done in multiple steps. For example, grinding and polishing are performed just before the insulating layer 28 provided in the concave part 22 is exposed in the first step, and then the insulating layer 28 is exposed in the following steps. The second surface 21 of the semiconductor substrate 10 may be etched, so that the conductive part 30 (or its part provided in the concave part 22) will project with its surface covered by the insulating layer 28. This etching may be done using an etchant that works more on the semiconductor substrate 10 (of silicon, for example) than on the insulating layer 28 (of $SiO_2$, for example). Examples of such an etchant may include $SF_6$, $CF_4$, and $Cl_2$ gas. The etching may be performed with dry etching equipment. Alternatively, the etchant may be a mixed liquid of hydrofluoric acid and nitric acid, or of hydrofluoric acid, nitric acid and acetic acid.

Thus, the conductive part 30 penetrates from the first surface 20 of the semiconductor substrate 10 to the second surface 21. The conductive part 30 is called a penetrating electrode. In the example shown in FIG. 4B, the conductive part 30 projects from the second surface 21. The projecting part of the conductive part 30 may be covered by the insulating layer 28. In the semiconductor devices as a collective having a stack structure, multiple semiconductor chips 40 are stacked on the first surface 20 and the sealing member 46 is also provided on the first surface 20. The above-mentioned manufacturing method can be applied to the semiconductor device of the present exemplary embodiment.

As shown in FIGS. 5A through 6B, a wiring layer (relocation wiring layer) 60 is provided on the semiconductor substrate 10. To simplify the illustrations, the semiconductor chip 40 and the sealing member 46 are omitted in FIGS. 5A through 6B.

Figure 5A:
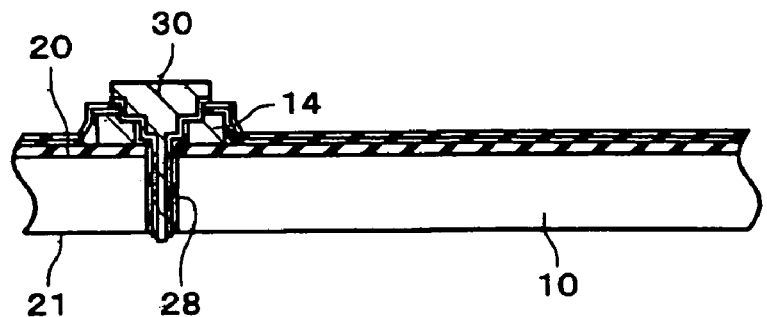
FIGS. 5A through D show the method for manufacturing a semiconductor device according to the first exemplary embodiment of the present invention.

First as shown in FIG. 5A, the conductive part 30 is exposed on the second surface 21 side. More specifically, the insulating layer 28 is removed so as to expose the conductive part 30 on the second surface 21 side. It is also possible to partly remove the conductive part 30, so that its fresh surface will be exposed. Here, the conductive part 30 may be exposed by grinding and polishing with a grinding stone or by etching.

Figure 5B:
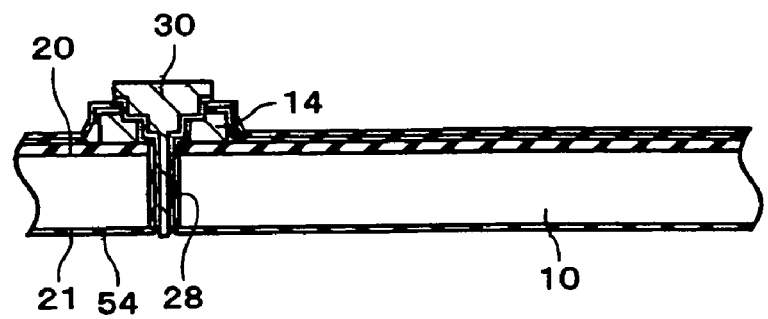

Next, an insulating layer 54 (an oxide or nitride film, for example) is formed as shown in FIG. 5B. The insulating layer 54 insulates an electrical connection between the semiconductor substrate 10 and a wiring layer 60 that will be described later. The insulating layer 54 is formed thoroughly on the second surface 21 except for the conductive part 30. The insulating layer 54 may be formed to thoroughly cover the conductive part 30 and then partly removed (or etched, for example) so as to expose the conductive part 30. Alternatively, the insulating layer 54 may be formed, leaving out the areas of the conductive part 30.

As a modification, the insulating layer 54 may be formed on the second surface 21 with the conductive part 30 covered by the insulating layer 28 as shown in FIG. 4B, and then the insulating layer 54 and the insulating layer 28 may be removed so as to expose the conductive part 30.

Figure 5C:
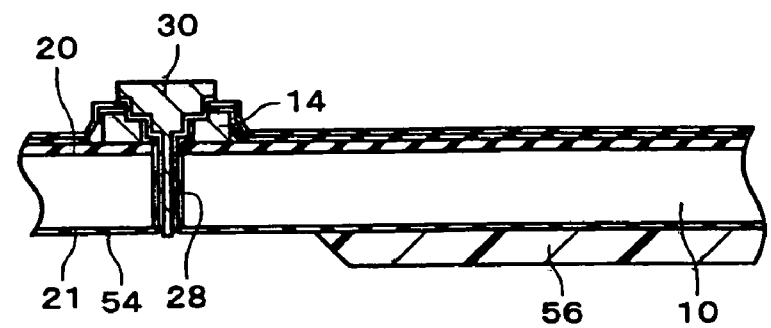

As shown in FIG. 5C, a resin layer 56 may be provided on the second surface 21. The resin layer 56 has a single or multi-layer structure. The resin layer 56 is formed, leaving out the areas of the conductive part 30. The resin layer 56 may be provided in multiple areas on the second surface 21. For example, the resin layer 56 may be formed so as to overlap an area surrounded by the electrode 14 provided in the plural number. The resin layer 56 may have an inclined plane to have a larger bottom than a top. The resin layer 56 may also have stress relaxation property. Examples of the material of the resin layer 56 may include polyimide resin, silicone modified polyimide resin, epoxy resin, silicone modified epoxy resin, benzocyclobutene (BCB), and polybenzoxazole (PBO).

Figure 5D:
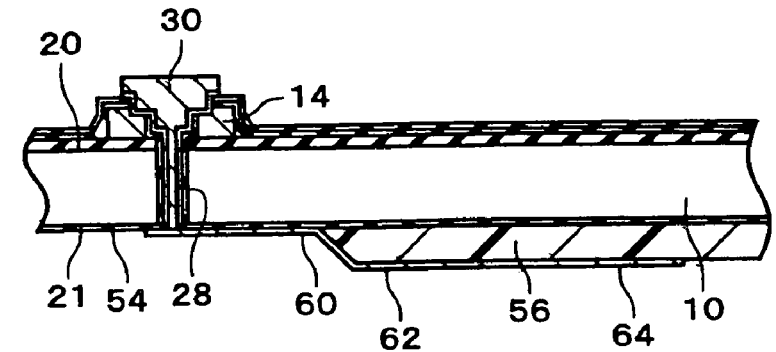

As shown in FIG. 5D, the wiring layer 60 (made of copper, for example) is provided on the second surface 21 side of the semiconductor substrate 10. The wiring layer 60 is electrically coupled to the conductive part 30 and provided on both the insulating layer 54 and the resin layer 56. The wiring layer 60 has a single or multi-layer structure. The wiring layer 60 may include a barrier layer made of such material as titanium, chromium, nickel, or titanium tungsten, for preventing diffusion. The wiring layer 60 is made by any one of or a combination of the following: sputtering, electrolytic plating, electroless plating, ink jetting, and printing. Also, the wiring layer 60 may be patterned by lithography. The wiring layer 60 includes a line part 62 and a land part 64 that is coupled to the line part. Part of the line part 62 overlaps the conductive part 30 and extends to reach the upper part of the resin layer 56. The land part 64 serves as an electric connection and its width is larger than that of the line part 62. The land part 64 is preferably placed on the resin layer 56. In this way, the stress imposed on the land part 64 is effectively released by the resin layer 56. The pitch of the land part 64 (between one land part and another adjacent land part) is larger than the case with the conductive part 30 (or the electrode 14). In other words, the pitch of the land part 64 is different from the pitch of the conductive part 30 (or the electrode 14). For example, the land part 64 provided in the plural number may spread out in an area array. This provides a stable surface of the land part 64 (or the external terminal 70), and thereby making it easy to package the semiconductor device.

Figure 6A:
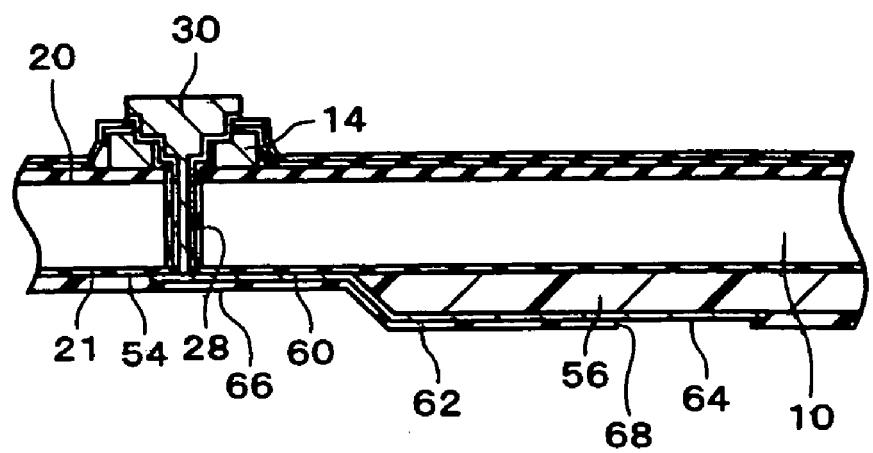
FIGS. 6A and B show the semiconductor device and the method for manufacturing the same according to the first exemplary embodiment of the present invention.

As shown in FIG. 6A, an insulating layer 66 (a solder resist, for example) is provided on the second surface 21 side of the semiconductor substrate 10. The insulating layer 66 is formed so as to cover some part of the wiring layer 60 (an end of the land part 64 and the line part 62, for example). In other words, the insulating layer 66 has an opening 68 for exposing other part of the wiring layer 60 (a central part of the land part 64, for example). The insulating layer 66 reduces or prevents the wiring layer 60 from getting oxidized and corroded and having an electrical failure.

Figure 6B:
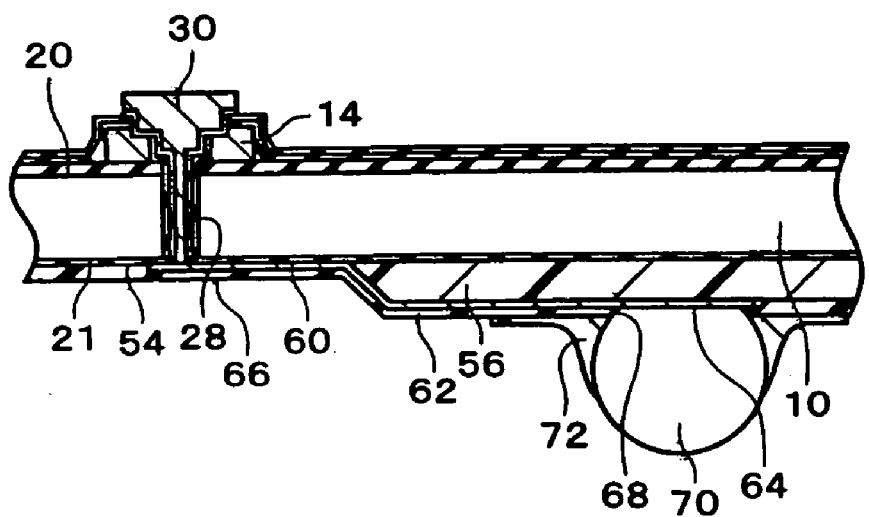

As shown in FIG. 6B, an external terminal 70 that is electrically coupled to the wiring layer 60 may be provided. The external terminal 70 is placed on the land part 64. When a central part of the land part 64 is exposed through the opening 68 of the insulating layer 66, the external terminal 70 is provided in the central part of the land part 64. Here, the resin layer 56 is between the external terminal 70 and the semiconductor substrate 10. The external terminal 70 may be made of a brazing material. This brazing material is made of solder, for example, either soft solder or hard solder. The external terminal 70 may be spherical, for example, a solder ball.

On the insulating layer 66, a coating layer 72 may be provided. The coating layer 72 has insulating property, and may be made of a resin material. The coating layer 72 also covers the base (lower part) of the external terminal 70. The coating layer 72 includes one part placed on the insulating layer 66 and another part rising from the one part so as to cover the base of the external terminal 70. The coating layer 72 reinforces at least the base of the external terminal 70. The coating layer 72 also releases the stress imposed on the external terminal 70 after packaging the semiconductor device.

Thus, the semiconductor devices as a collective having a stack structure is completed. The semiconductor devices are equipped with the relocation wiring layer. The above-mentioned manufacturing method can be applied to the semiconductor device of the present exemplary embodiment.

While the semiconductor substrate 10 is made thin in the present exemplary embodiment, it is possible to provide the wiring layer 60 and the external terminal 70 in a stable manner since the semiconductor chip 40 and the sealing member 46 are provided on the first surface 20 to reinforce the semiconductor substrate 10.

Figure 7A:
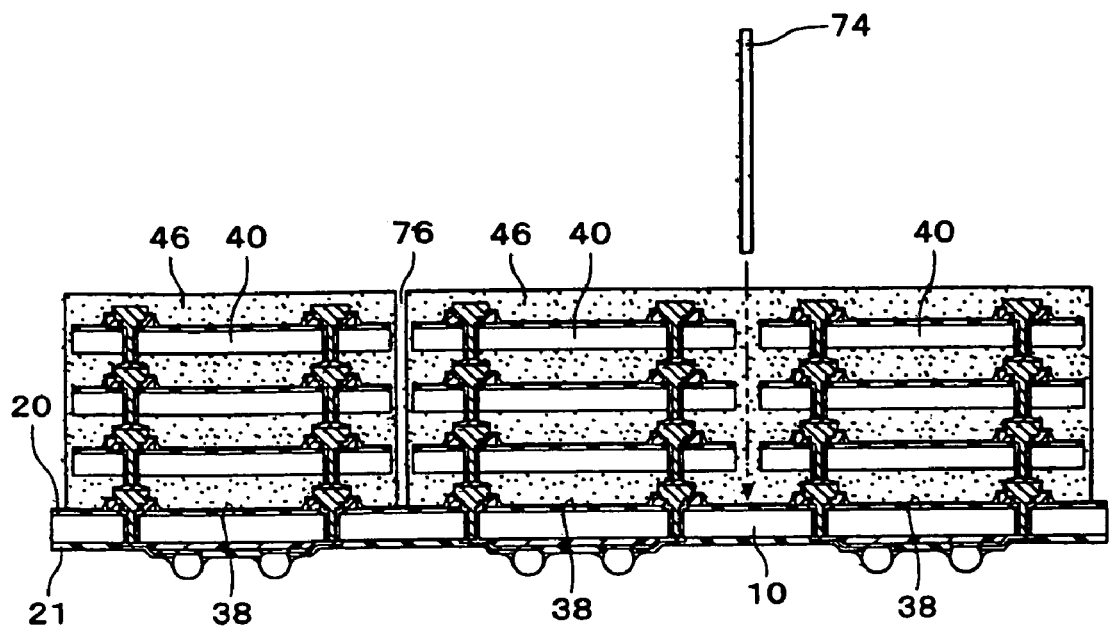
FIGS. 7A and B show the method for manufacturing a semiconductor device according to the first exemplary embodiment of the present invention.

Subsequently, cutting (dicing) is performed as shown in FIGS. 7A and B. More specifically, one chip mounting area 38 (or one semiconductor chip 40) is separated from another adjacent chip mounting area 38 (or another adjacent semiconductor chip 40) so as to make pieces each of which is a semiconductor device shown in FIG. 8. Cutting may be performed with a cutter (a dicer, for example) or with a laser (e.g. $CO_2$ laser, YAG laser). Alternatively, cutting may be performed by machine cutting work. In the present exemplary embodiment, multiple steps (two, for example) of cutting work are included. Alternatively, the sealing member 46 and the semiconductor substrate 10 may be cut all at once in a single step of cutting work.

First, the sealing member 46 is cut with a first cutter 74 as shown in FIG. 7A, It is possible to cut only the sealing member 46. Here, the sealing member 46 may be cut completely or partly in its thickness direction. In this case, it is possible not to cut the semiconductor substrate 10 at all. Alternatively, it is also possible to cut part of the semiconductor substrate 10 (for example, its surface) as well as the sealing member 46. A concave part 76 is made in the sealing member 46 as a result of cutting according to the width (or the thickness) of the first cutter 74.

Figure 7B:
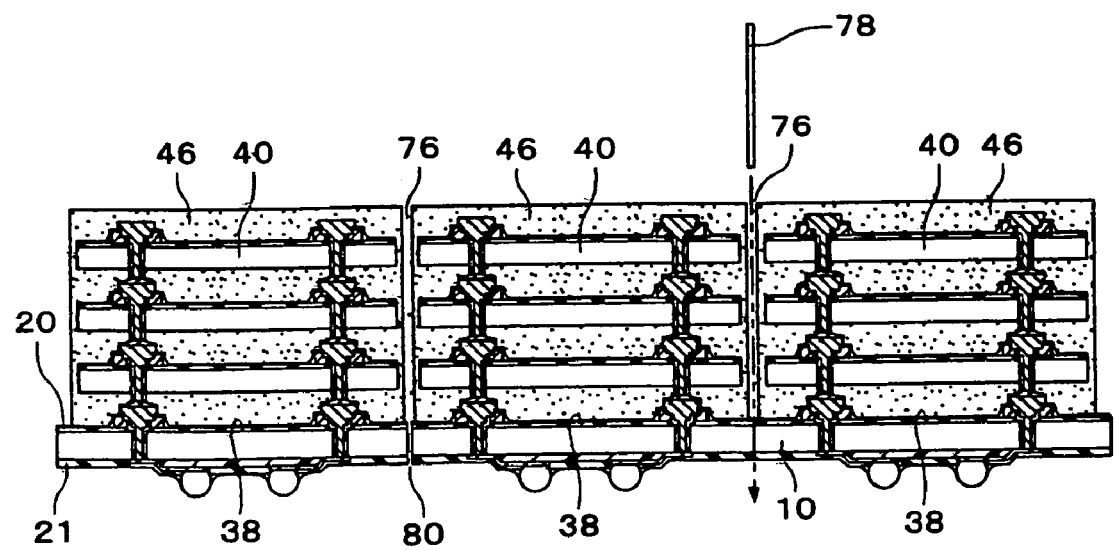

Then, the semiconductor substrate 10 is cut with a second cutter 78 as shown in FIG. 7B. The semiconductor substrate 10 may be cut either from the first surface 20 side or from the second surface 21 side. If it is cut from the first surface 20 side, the second cutter 78 is inserted into the concave part 76. The width (thickness) of the second cutter 78 may be smaller than that of the first cutter 74. The width of a concave part 80 made with the second cutter 78 may be smaller than the width of the concave part 76. An exemplary modification, cutting of the semiconductor substrate 10 may be followed by cutting of the sealing member 46 in reverse to what has described above.

Accordingly, it is possible to cut plural objects (the sealing member 46 and the semiconductor substrate 10) in the best way for each of the objects. This addresses avoiding cutting defects even if some chips (chips of the sealing member 46, for example) cling to the first cutter 74, by using not the first cutter 74 but the second cutter 78 for cutting the semiconductor substrate 10.

Figure 8:
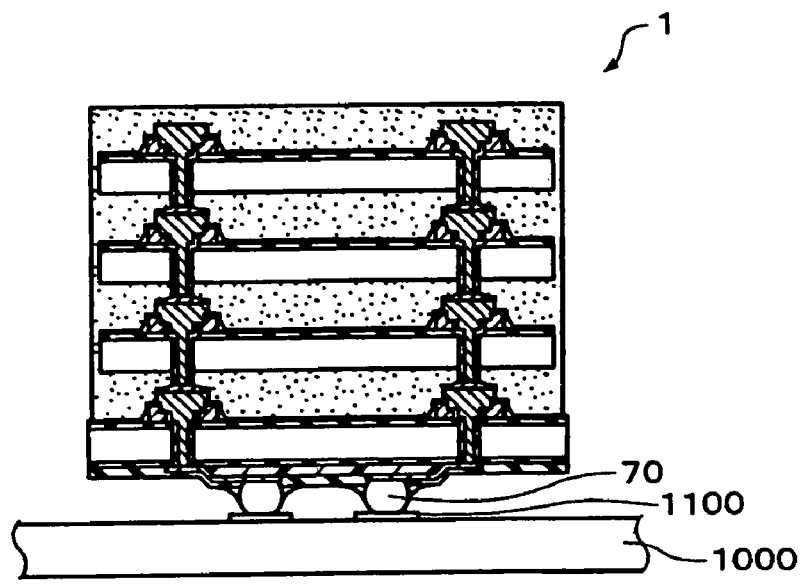
FIG. 8 is a schematic that shows the semiconductor device and a circuit board according to the first exemplary embodiment of the present invention.
Figure 9:
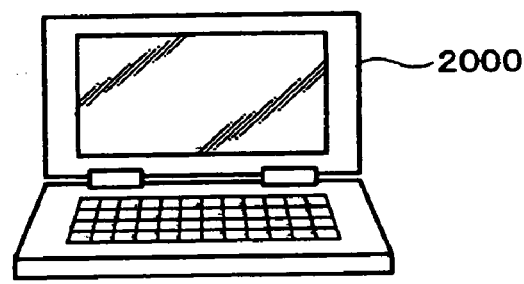
FIG. 9 is a schematic that shows an electronic apparatus of one exemplary embodiment of the present invention.
Figure 10:
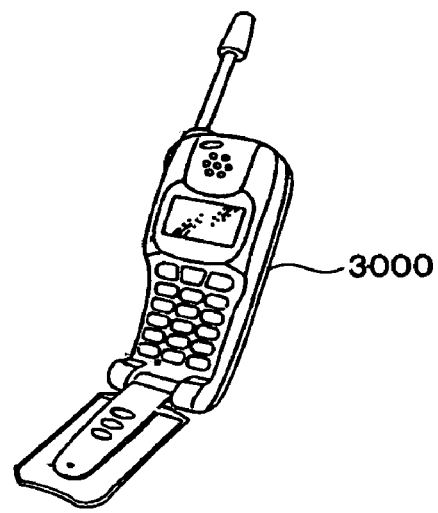
FIG. 10 is a schematic that shows an electronic apparatus of another exemplary embodiment of the present invention.

Thus, the semiconductor device as a single unit having a stack structure is completed as shown in FIG. 8. A semiconductor device 1 is mounted on a circuit board 1000 (a mother board, for example). Provided on the circuit board 1000 is a wiring pattern 1100 to which the external terminal 70 is electrically coupled. The above-mentioned manufacturing method can be applied to the semiconductor device of the present exemplary embodiment. For example of electronic apparatuses having a semiconductor device according to one exemplary embodiment of the present invention, FIG. 9 shows a notebook computer 2000 and FIG. 10 shows a cellular phone 3000.

As an exemplary modification of the present exemplary embodiment, a semiconductor substrate (a silicon substrate, for example) having no IC on it can be used instead of the semiconductor substrate 10 in order to address or achieve the above-mentioned structure. This semiconductor substrate works as an interposer of a semiconductor package. Having this semiconductor part standing between the semiconductor chip 40 and the circuit board 1000, it is possible to reduce a dielectric constant and reduce a signal delay compared to a case with an insulator (a resin substrate, for example) in between the two.

As another exemplary modification of the exemplary embodiment, a substrate of other types than semiconductor substrates may be used to address or achieve the above-mentioned structure. Examples of this may include a substrate made of an organic material (a resin substrate etc.), inorganic material (a glass substrate etc.), and mixed material. Also, examples of this may include both a rigid substrate and flexible substrate. Here, the substrate works as an interposer of a semiconductor package. The substrate has no IC provided on it. A conductive part penetrating the substrate is called a through-hole. All other above-mentioned points with the semiconductor substrate 10 can be applied to this substrate.

Figure 11A:
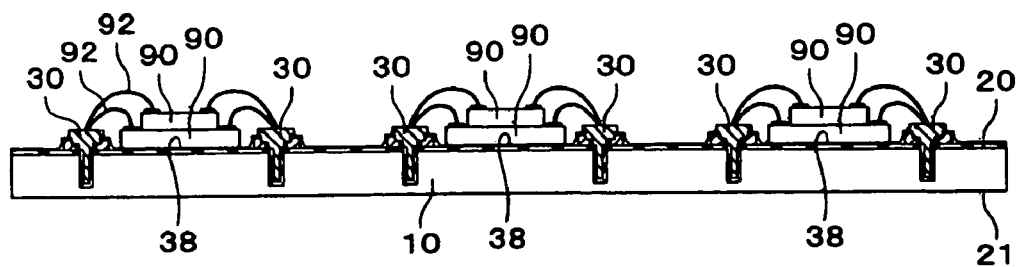
FIGS. 11A through C show a semiconductor device and a method for manufacturing the same according to a second exemplary embodiment of the present invention.
Figure 11B:
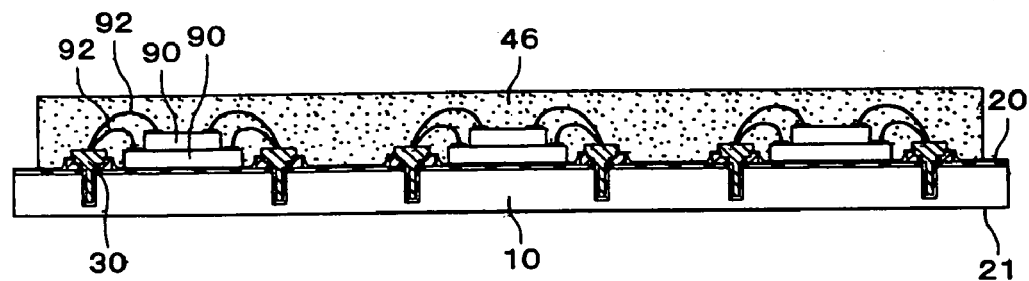
Figure 11C:
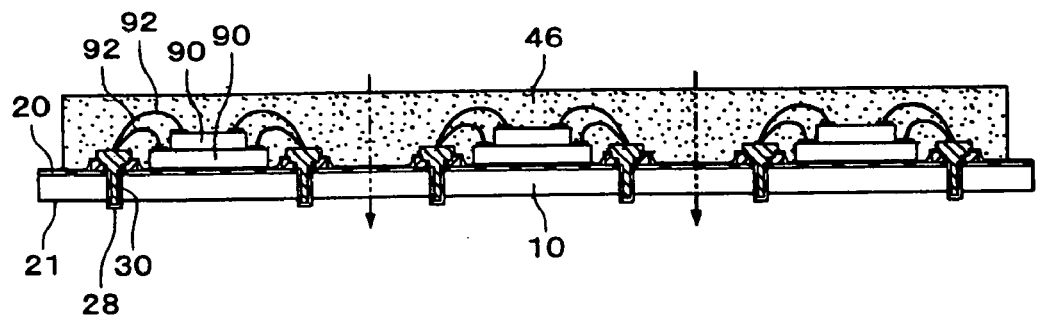

FIGS. 11A through C show a semiconductor device and a method for manufacturing the semiconductor device according to a second exemplary embodiment of the present invention. In the present exemplary embodiment, at least one semiconductor chip 90 is stacked in each chip mounting area 38 of the semiconductor substrate 10. As shown in FIG. 11A, the semiconductor chip 90 may be fixed by using face-up bonding. In this case, a wire binding technique may be used. In other words, the semiconductor chip 90 may be electrically coupled to the conductive part 30 of the semiconductor substrate 10 with a wire 92 therebetween. Alternatively, the semiconductor chip 90 may be fixed by using face-down bonding. Subsequently, the sealing member 46 is provided on the first surface 20 as shown in FIG. 11B, and then the semiconductor substrate 10 is made thin as shown in FIG. 11C. By making the semiconductor substrate 10 thin, the conductive part 30 may project from the second surface 21. The projecting part of the conductive part 30 may be covered by the insulating layer 28. Subsequently, one chip mounting area 38 (or one semiconductor chip 90) is separated from another adjacent chip mounting area 38 (or another adjacent semiconductor chip 90) so as to make pieces as indicated by the arrows in FIG. 11C. Prior to the separation, a wiring layer (relocation wiring layer) may be provided on the semiconductor substrate 10. Other aspects of the exemplary embodiment are the same as the above-mentioned structure. The above-mentioned manufacturing method can be applied to the semiconductor device of the present exemplary embodiment.

The present invention is not limited to the above-mentioned exemplary embodiments, and various changes and modifications can be made within the spirit and scope of the invention. For example, the present invention includes substantially the same structure (including the structure with the same functions, methods, and results and the structure with the same goals and results) as the structure of the above-mentioned exemplary embodiments. The present invention also includes other structures in which non-essential elements of the above-mentioned exemplary embodiments are substituted. The present invention also includes the structures that can achieve the same effects or the same goals as those achieved by the above-mentioned exemplary embodiments. Moreover, the present invention includes other structures in which known methods and techniques are incorporated into the above-mentioned exemplary embodiments.

What is claimed is:

1. A method for manufacturing a semiconductor device, comprising:
   (a) forming a conductive part in a concave part on a first surface of a substrate, the first surface having a plurality of chip mounting areas;
   (b) stacking a semiconductor chip in the chip mounting areas;
   (c) providing a sealing member above the first surface of the substrate, wherein the sealing members reinforces the substrate and seals at least one semiconductor chip, and forming a mask having an opening on the first surface of the substrate and filling the opening with a material of the sealing member, and
   (d) making part of a second surface of the substrate thin so as to make the conductive part penetrate from the first surface to the second surface.

2. The method for manufacturing a semiconductor device according to claim 1, after steps (a) through (d), further comprising:
   cutting a portion between the chip mounting areas to make a plurality of pieces.

3. The method for manufacturing a semiconductor device according to claim 2, further including cutting the sealing member with a first cutter, while the substrate is cut with a second cutter.

4. The method for manufacturing a semiconductor device according to claim 1, step (a) further including forming the concave part on the substrate;
   forming an insulating layer inside the concave part; and
   forming the conductive part in the concave part with the insulating layer therebetween.

5. The method for manufacturing a semiconductor device according to claim 1, step (b) further including mounting at least one chip in each of the chip mounting areas.

6. The method for manufacturing a semiconductor device according to claim 1, step (b) further including stacking a dummy chip in any of the chip mounting areas.

7. The method for manufacturing a semiconductor device according to claim 6, step (b) further including mounting at least one chip in each of the chip mounting areas, the chip being the semiconductor chip or the dummy chip.

8. The method for manufacturing a semiconductor device according to claim 1, the semiconductor chip further including a penetrating electrode penetrating to the both sides, and step (b) further including coupling electrically the semiconductor chip to the conductive part on the substrate with the penetrating electrode therebetween.

9. The method for manufacturing a semiconductor device according to claim 1, step (b) further including coupling electrically the semiconductor chip to the conductive part on the substrate with a wire therebetween.

10. The method for manufacturing a semiconductor device according to claim 1, further including performing step (c) in a chamber in which a pressure is reduced from atmospheric pressure.

11. The method for manufacturing a semiconductor device according to claim 1, after step (d), further comprising:
    forming a wiring layer to include a plurality of land parts electrically coupled to the conductive part.

12. The method for manufacturing a semiconductor device according to claim 11, further comprising:
    forming a resin layer on the second surface side of the substrate, the resin layer on which the land parts are formed.

13. The method for manufacturing a semiconductor device according to claim 11, further comprising:
    providing an external terminal on the land parts.

14. The method for manufacturing a semiconductor device according to claim 1, the substrate being a semiconductor substrate.

15. The method for manufacturing a semiconductor device according to claim 14, further comprising:
    providing a plurality of integrated circuits on the semiconductor substrate; and
    placing the integrated circuits in each of the chip mounting areas and electrically coupling the integrated circuits to the conductive part.

16. The method for manufacturing a semiconductor device according to claim 1, the substrate being an interposer.

* * * * *